United States Patent [19]
Saito

[11] Patent Number: 6,115,224
[45] Date of Patent: Sep. 5, 2000

[54] SPIN-VALVE TYPE THIN FILM ELEMENT AND ITS MANUFACTURING METHOD

[75] Inventor: Masamichi Saito, Niigata, Japan

[73] Assignee: Alps Electric Co., Ltd., Tokyo, Japan

[21] Appl. No.: 09/177,989

[22] Filed: Oct. 23, 1998

[30]  Foreign Application Priority Data

Oct. 24, 1997 [JP] Japan .................................. 9-292793

[51] Int. Cl.[7] .................................................. G11B 5/127
[52] U.S. Cl. .................................................. 360/324.1
[58] Field of Search .................................. 360/113, 126, 360/324.1, 324, 324.11, 324.12, 313; 324/252

[56]  References Cited

U.S. PATENT DOCUMENTS

| | | | |
|---|---|---|---|
| 5,159,513 | 10/1992 | Dieny et al. | 360/113 |
| 5,206,590 | 4/1993 | Dieny et al. | 324/252 |
| 5,287,238 | 2/1994 | Baumgart et al. | 360/113 |
| 5,373,238 | 12/1994 | McGuire et al. | 324/252 |
| 5,465,185 | 11/1995 | Heim et al. | 360/113 |
| 5,650,958 | 7/1997 | Gallagher et al. | 365/173 |
| 5,729,410 | 3/1998 | Fontana, Jr. et al. | 360/113 |
| 5,959,810 | 9/1999 | Kakihara et al. | 360/113 |

FOREIGN PATENT DOCUMENTS 9092908A  4/1997  Japan .

*Primary Examiner*—Allen T. Cao
*Attorney, Agent, or Firm*—Brinks Hofer Gilson & Lione

[57]  ABSTRACT

The object of the present invention is to solve the problems that inductive magnetic anisotropy of the free magnetic layer can not be directed along the track width direction because all the layers of the antiferromagnetic layer, pinned magnetic layer and free magnetic layer are deposited by applying a magnetic field along the height direction or, although the free magnetic layer is deposited while applying a magnetic field along the track width direction, the other layers are also deposited while applying a magnetic field along the height direction.

The problems described above can be solved by forming the antiferromagnetic layer out of an antiferromagnetic material that can cause an exchange coupling by a heat treatment, and by depositing the antiferromagnetic layer, pinned magnetic layer and free magnetic layer at room temperature while applying a magnetic field along the X-direction, followed by a heat treatment. The procedure above enables inductive magnetic anisotropy of the free magnetic layer to be properly aligned along the X-direction prior to depositing the hard vias layer.

20 Claims, 5 Drawing Sheets

DIRECTION OF MAGNETIC FIELD DURING DEPOSITION:
Tw DIRECTION FOR ALL LAYERS

EXAMPLE

SPIN-VALVE TYPE THIN FILM ELEMENT AND ITS MANUFACTURING METHOD

BACKGROUND OF THE INVENTION

1. Field of the Invention

The present invention relates to a so called spin-valve type thin film element in which electric resistance is changed by the relation between the direction of magnetization of a pinned magnetic layer and the direction of magnetization of a free magnetic layer that is influenced by the external magnetic field, especially to a spin valve type thin film element in which induced magnetic anisotropy of the free magnetic layer is made to be generated along a proper direction using an antiferromagnetic layer that causes an exchange coupling by applying a heat treatment, and its manufacturing method.

2. Description of the Related Art

FIG. 7 is a cross section in the vicinity of the ABS surface of a conventional spin-valve type thin film element for sensing recording magnetic field from a recording medium such as a hard disk.

An underlayer 6, a free magnetic layer 4, a non-magnetic electrically conductive layer 3, a pinned magnetic layer 2, an antiferromagnetic layer 10 and a protective layer 7 are continuously formed from the bottom to the top in this spin-valve type thin film element, on both side S of which hard magnetic bias layers 5, 5 are formed.

Usually, a Fe—Mn (iron—manganese) alloy film is used for the antiferromagnetic layer 10, a Ni—Fe (nickel—iron) alloy film is used for the pinned magnetic layer 2 and free magnetic layer 4, a Cu (copper) layer film is used for the electrically conductive layer 3 and a Co—Pt (cobalt—platinum) alloy film is used for the hard magnetic bias layers 5, 5. The underlayer 6 and protective layer 7 are formed of a non-magnetic material such as Ta (tantalum).

An exchange anisotropic magnetic field due to exchange coupling is created, without applying any heat treatment, at the interface between the pinned magnetic layer 2 and antiferromagnetic layer 10 by depositing the films of the pinned magnetic layer 2 and antiferromagnetic layer 10 while applying a magnetic field along the Y-direction (the height direction; the direction of the leakage magnetic field from recording media) since the antiferromagnetic layer 10 is formed of the Fe—Mn alloy film, thereby fixing magnetization of the pinned magnetic layer 2 along the Y-direction forming a single magnetic domain caused by the exchange anisotropic magnetic field.

The hard magnetic bias layers 5, 5 are magnetized along the X-direction (the track width direction), thereby allowing magnetization of the free magnetic layer 4 to be aligned along the X-direction.

The first step for producing the spin-valve type thin film element shown in FIG. 7 comprises depositing six layers from the underlayer 6 to the protective layer 7 (referred to a laminated body hereinafter) while applying a magnetic field along the Y-direction.

An exchange anisotropic magnetic field is generated at the interface between the pinned magnetic field 2 and antiferromagnetic layer 10 in this deposition step, fixing magnetization of the pinned magnetic field 2 along the Y-direction.

In the next step, the laminated body is processed to a prescribed shape by, for example, ion milling, followed by depositing the hard bias layers 5, 5 and conductive layers 8, 8 on both sides of the laminated body.

A stationary current (a sensing current) is imparted from the conductive layer 8, 8 to the pinned magnetic field 2, non-magnetic conductive layer 3 and free magnetic layer 4 in this spin-valve type thin film element. While the travelling direction of the recording medium such as a hard disk is along the Z-direction, the magnetization direction of the free magnetic layer 4 is turned from the X-direction to the Y-direction when the leakage magnetic field from the recording medium is applied along the Y-direction. Electric resistance is fluctuated depending on the relation between the variation of the magnetization direction within this free magnetic layer 4 and pinned magnetization direction in the pinned magnetic field 2, sensing the leakage magnetic field from the recording medium due to voltage changes based on the fluctuation of the electric resistance.

However, because the laminated body from the underlayer 6 to the protective layer 7 is deposited while applying a magnetic field along the Y-direction in the spin-valve type thin film element shown in FIG. 7, an inductive magnetic anisotropy is induced along the Y-direction in the free magnetic layer 4, allowing the Y-direction of the free magnetic layer 4 to be an easy axis of magnetization.

Accordingly, the magnetization of the free magnetic layer 4 when the laminated body has been deposited is aligned along the Y-direction, forming a large coercive force along the Y-direction.

After depositing the laminated body, hard bias layers 5 are deposited on both sides of the laminated body to align magnetization of the free magnetic layer 4 along the X-direction. However, magnetization can not be properly aligned along the X-direction because not only bias magnetic field but also inductive magnetic anisotropy is applied to the free magnetic layer 4, thereby deteriorating reproduction characteristic in that Barkhausen noises are liable to be generated.

Japanese Unexamined Patent Publication No. 9-92908 describes an invention titled "Method for Producing Magnetoresistive Element" that discloses a different production method from those as hitherto described.

The spin-valve type thin film element described in this publication is, like those as shown in FIG. 7, composed of a free magnetic layer 4 (described as a "functional film" in the publication), non-magnetic conductive layer 3 (described as a "non-magnetic film" in the publication), a pinned magnetic layer 2 (described as a "magnetization pinning film" in the publication) and an antiferromagnetic layer 10 (described as an "antiferromagnetic film" in the patent publication) from the bottom to the top.

At first, the magnetic layer 4 is deposited while applying a magnetic field along the X-direction (the track width direction; described as "magnetic field impressing direction 21A" in the foregoing patent publication) shown in FIG. 7 using a sputtering apparatus that are able to rotate its substrate holder (the reference numeral 67 shown in FIG. 6 and FIG. 10 in the foregoing patent publication) by an angle of 90 degree in depositing each layer described above.

Then, the substrate holder is rotated by an angle of 90 degree and, while applying a magnetic field along the Y-direction shown in FIG. 7 (the height direction; described as "magnetic field impressing direction 21B" in the foregoing patent publication), a non-magnetic conductive layer 3, a pinned magnetic layer 2 and an antiferromagnetic layer 10 are deposited on the free magnetic layer 4.

Since the antiferromagnetic layer 10 described above are formed of a Fe—Mn alloy film, an exchange coupling is generated during deposition in the magnetic field, therefore magnetization of the pinned magnetic layer is fixed along the Y-direction forming a single magnetic domain.

The X-direction of the free magnetic layer 4 is described to be made as an easy axis of magnetization in the production method described in the foregoing patent publication because the free magnetic layer 4 is deposited by applying a magnetic field along the X-direction.

However, it is thought to be difficult to allow the X-direction of the free magnetic layer 4 to be the direction of the easy axis of magnetization by the following reasons in the production method as described in the foregoing publication when the anti-ferromagnetic layer 10, which acquires an exchange coupling with the pinned magnetic layer 2 at the interface by applying a heat treatment under a magnetic field along the Y-direction (the height direction), is used.

Because the free magnetic layer 4 is deposited while applying a magnetic field along the X-direction, an inductive magnetic anisotropy along the X-direction is in the free magnetic layer 4 immediately after depositing the free magnetic layer 4, thereby the free magnetic layer 4 is magnetized with its X-direction to be an easy axis of magnetization.

Meanwhile, since the non-magnetic conductive layer 3, the pinned magnetic layer 2 and the antiferromagnetic layer 10 formed on the free magnetic layer 4 is deposited by applying a magnetic field along the Y-direction, the magnetization direction of the free magnetic layer 4 is directed along the Y-direction during deposition of the three layers described above and the pinned magnetic layer 2 is endowed with inductive magnetic anisotropy along the Y-direction.

A magnetic inter-layer interaction to align the magnetization directions with each other is applied between the pinned magnetic layer 2 and free magnetic layer 4 confronting via the very thin non-magnetic conductive layer 3 when the pinned magnetic layer 2 is deposited while being endowed with inductive magnetic anisotropy along the Y-direction. Accordingly, inductive magnetic anisotropy of the free magnetic layer 4 that has been applied along the X-direction is distorted to some extent due to deposition of the pinned magnetic layer 2 immediately after deposition of the free magnetic layer 4.

The fact that inductive magnetic anisotropy along the X-direction is distorted to some extent corresponds to a phenomenon wherein the X-component of magnetic anisotropy is reduced as a result of added vectors along the X-direction and Y-direction along with turning the direction of inductive magnetic anisotropy of the free magnetic layer 4 from the X-direction to the Y-direction by a small degree, because inductive magnetic anisotropy along the Y-direction is also applied to the free magnetic layer 4 from the pinned magnetic layer 2.

When the antiferromagnetic layer 10, which generates an exchange coupling at the interface between the antiferromagnetic layer 10 and pinned magnetic layer 2 by applying a heat treatment under a magnetic field along the Y-direction, is used, the layer is subjected to the heat treatment while magnetization directions of the free magnetic layer 4 and pinned magnetic layer 2 are aligned along the Y-direction (when magnetization along the Y-direction is saturated). Since inductive magnetic anisotropy induced by the heat treatment is added to the free magnetic layer 4 along the Y-direction, inductive magnetic anisotropy of the free magnetic layer 4, being applied along the X-direction immediately after depositing the free magnetic layer 4, is distorted to some extent from the X-direction by applying a heat treatment.

Accordingly, inductive magnetic anisotropy of the free magnetic layer 4 before the heat treatment, or when deposition of the entire laminated body has been completed, should be made to be as hardly distorted from the X-direction as possible when the ferromagnetic layer, which causes an exchange coupling at the interface with the pinned magnetic layer 2 by applying a heat treatment under a magnetic field along the Y-direction, is used. Therefore, the deposition method in which a magnetic field is applied along the Y-direction is not preferable.

It is necessary in the invention described in the foregoing patent publication to newly produce a sputtering apparatus being able to rotate the substrate holder by an angle of 90 degree. Therefore, existing sputtering apparatus being able to apply the magnetic field only along one direction can not be used, imposing construction of separate facilities.

SUMMARY OF THE INVENTION

The object of the present invention for solving the hitherto encountered problems described above is to provide a spin-valve type thin film element in which inductive magnetic anisotropy of the free magnetic layer after deposition is made to be properly aligned along the track width direction, and a method for producing the same.

The present invention provides a spin-valve type thin film element having an antiferromagnetic layer, a pinned magnetic layer formed in contact relation to this antiferromagnetic layer and in which the magnetization direction is fixed due to an exchange anisotropic magnetic field with the antiferromagnetic field and a free magnetic layer formed over and/or under the pinned magnetic layer via a non-magnetic conductive layer, a bias layer for aligning the magnetization direction of the free magnetic layer along the direction to cross with the magnetization direction of the pinned magnetic layer and a conductive layer for imparting a sensing current to the pinned magnetic layer, non-magnetic conductive layer and free magnetic layer being additional provided, wherein the antiferromagnetic layer is formed of an antiferromagnetic material that causes an exchange coupling by applying a heat treatment and coercive force of the free magnetic layer in the absence of the bias layer is 2 Oe or less.

Inductive magnetic anisotropy of the free magnetic layer in the absence of the bias layer is directed along the track with direction in the present invention.

It is preferable in the present invention that the antiferromagnetic layer is formed of a Pt—Mn alloy.

A X—Mn alloy (X=Ni, Pd, Rh, Ru, Ir and Os) may be used in the present invention instead of the Pt—Mn alloy.

A Pt—Mn—X alloy (X=Ni, Pd, Rh, Ru, Ir, Cr and Co) may be also used in the present invention instead of the Pt—Mn alloy.

The present invention provides a method for producing a spin-valve type thin film element having an antiferromagnetic layer, a pinned magnetic layer formed in contact relation to this antiferromagnetic layer and in which the magnetization direction is fixed due to a exchange anisotropic magnetic field with the antiferromagnetic field and a free magnetic layer formed over and/or under the pinned magnetic layer via a non-magnetic conductive layer, a bias layer for aligning the magnetization direction of the free magnetic layer along the direction to cross with the magnetization direction of the pinned magnetic layer and a conductive layer for imparting a sensing current to the pinned magnetic layer, non-magnetic conductive layer and free magnetic layer being additional provided, comprising the steps of:

depositing at least the antiferromagnetic layer, pinned magnetic layer and free magnetic layer while applying a magnetic field along the track width direction, inductive magnetic anisotropy of the free magnetic layer being allowed to direct along the track width direction;

applying a heat treatment after deposition while applying a magnetic field along the height direction to cause an exchange coupling at the interface between the antiferromagnetic layer and pinned magnetic layer, thereby fixing magnetization of the pinned magnetic layer along the height direction; and forming a laminated body comprising an antiferromagnetic layer, a pinned magnetic layer, a non-magnetic conductive layer and a free magnetic layer into prescribed shapes, followed by forming bias layers magnetized along the track width direction on both sides of the laminated body.

It is preferable in the method described above that the antiferromagnetic layer is formed of a Pt—Mn alloy.

A X—Mn alloy (X=Ni, Pd, Rh, Ru, Ir, and Os) may be used in the present invention instead of the Pt—Mn alloy.

A Pt—Mn—X alloy (X=Ni, Pd, Rh, Ru, Ir, Cr and Co) may be also used in the present invention instead of the Pt—Mn alloy.

A laminated body comprising an antiferromagnetic layer, a pinned magnetic layer, a non-magnetic conductive layer and a free magnetic layer was deposited while applying a magnetic field along the height direction, or a free magnetic layer was deposited while applying a magnetic field along the track width direction as described in Japanese Unexamined Patent Publication No. 9-92908 but the other layers were deposited under a magnetic field along the height direction in the prior art.

Although magnetization of the pinned magnetic layer should be fixed along the height direction to align magnetization of the free magnetic layer along the track width direction in the spin-valve type thin film element, it was necessary in the prior art to deposit the antiferromagnetic layer and pinned magnetic layer while applying a magnetic field along the height direction to fix magnetization of the pinned magnetic layer in the deposition step, because the antiferromagnetic layer was formed of an antiferromagnetic material such as a Fe—Mn alloy film that generates an exchange coupling immediately after deposition, or during deposition.

The antiferromagnetic layer is formed using an antiferromagnetic material such as a Pt—Mn alloy film that generates an exchange coupling through annealing (heat treatment) in the magnetic field.

Since any exchange coupling does not arise at the interface between the antiferromagnetic layer and pinned magnetic layer in the deposition step, the free magnetic layer as well as the antiferromagnetic layer and pinned magnetic layer are deposited in the present invention while applying a magnetic field along the track width direction.

Accordingly, inductive magnetic anisotropy of the free magnetic layer is constantly directed along the track width direction to allow the track width direction of the free magnetic layer to be the easy axis of magnetization since only the magnetic field along the track width direction is impressed during deposition in the free magnetic layer.

Since the antiferromagnetic layer, pinned magnetic layer and free magnetic layer are deposited while applying a magnetic field along the track width direction in the present invention, the conventionally used sputtering apparatus that can apply a magnetic field only along one direction may be used.

An exchange anisotropic magnetic field due to the exchange coupling is generated at the interface between the antiferromagnetic layer and pinned magnetic layer by subjecting the layers to a heat treatment after deposition while applying a magnetic field along the height direction, making it possible to fix magnetization of the pinned magnetic layer along the height direction.

Although magnetization of the free magnetic layer that has been aligned along the track width direction due to inductive magnetic anisotropy induced during deposition is once reversed by the magnetic field along the height direction applied during the heat treatment, magnetization of the free magnetic field is aligned again along the track width direction when the magnetic field is removed owing to inductive magnetic anisotropy induced along the track width direction.

As hitherto described, it is made possible in the present invention to deposit the antiferromagnetic layer, pinned magnetic layer and free magnetic layer while applying a magnetic field along the track width direction by using a ferromagnetic material that can arise an exchange coupling only when the antiferromagnetic layer is subjected to a heat treatment, thereby making it possible to properly induce inductive magnetic anisotropy of the free magnetic layer along the track width direction allowing the track width direction of the free magnetic layer to be an easy axis of magnetization.

Consequently, the height direction (the direction of the leakage magnetic field from the external magnetic field) is allowed to be a hard axis of magnetization in the step prior to deposition of the bias layer, making it possible to reduce the coercive force along the height direction. It is possible in the present invention that the coercive force prior to depositing the bias layer is reduced to be 2 Oe (Oersted) or less.

DESCRIPTION OF THE PREFERRED EMBODIMENT

Figure 1:
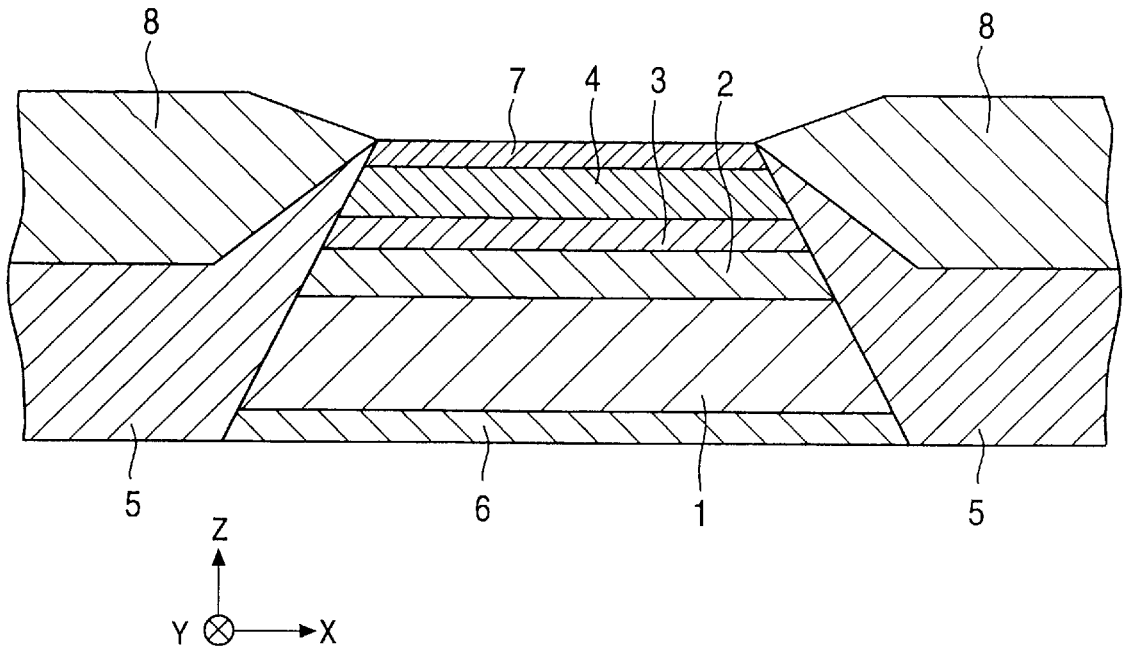
FIG. 1 is a cross section of the structure of the spin-valve type thin film element according to the first embodiment of the present invention viewed from the ABS (Air Bearing Surface) side.

FIG. 1 is a cross section of the structure of the spin-valve type thin film element according to the first embodiment of the present invention viewed from the ABS side. Only the central portion of the element elongating along the X-direction is shown by a broken line in FIG. 1.

The spin-valve type thin film element shown in FIG. 1 is attached to the end of a trailing side of a floating type slider mounted on a hard disk drive to sense recording magnetic field from the hard disk. The traveling direction of the magnetic recording medium such as a hard disk is along the Z-direction and the leakage magnetic field direction of the magnetic recording medium is along the Y-direction.

Figure 2:
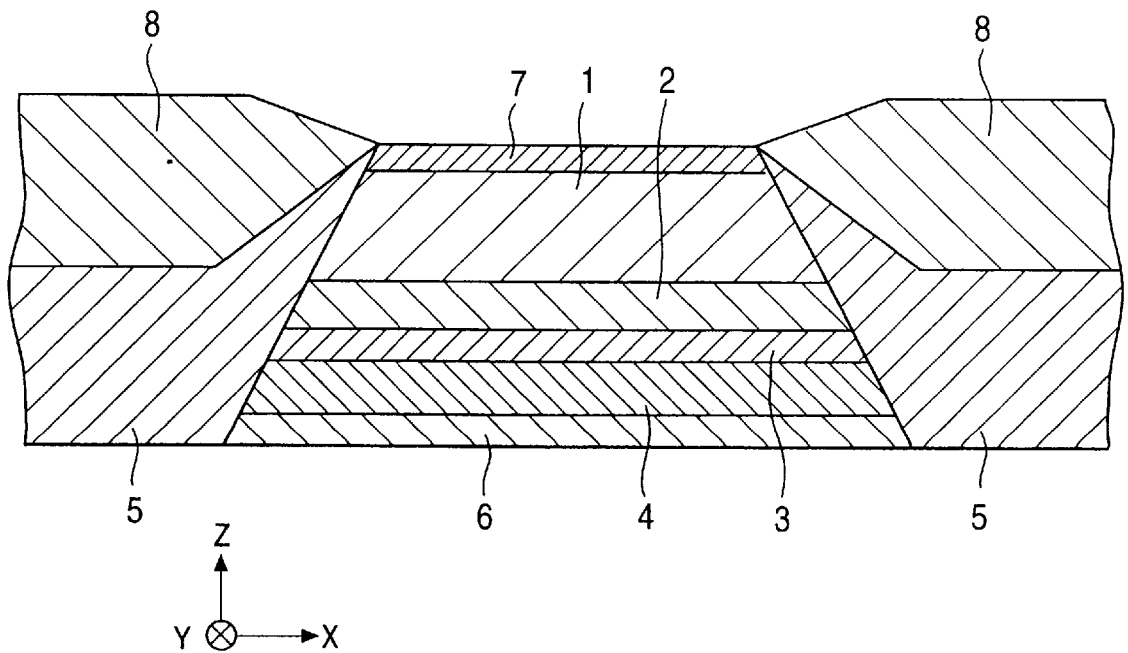
FIG. 2 is a cross section of the structure of the spin-valve type thin film element according to the second embodiment of the present invention viewed from the ABS side.
Figure 3:
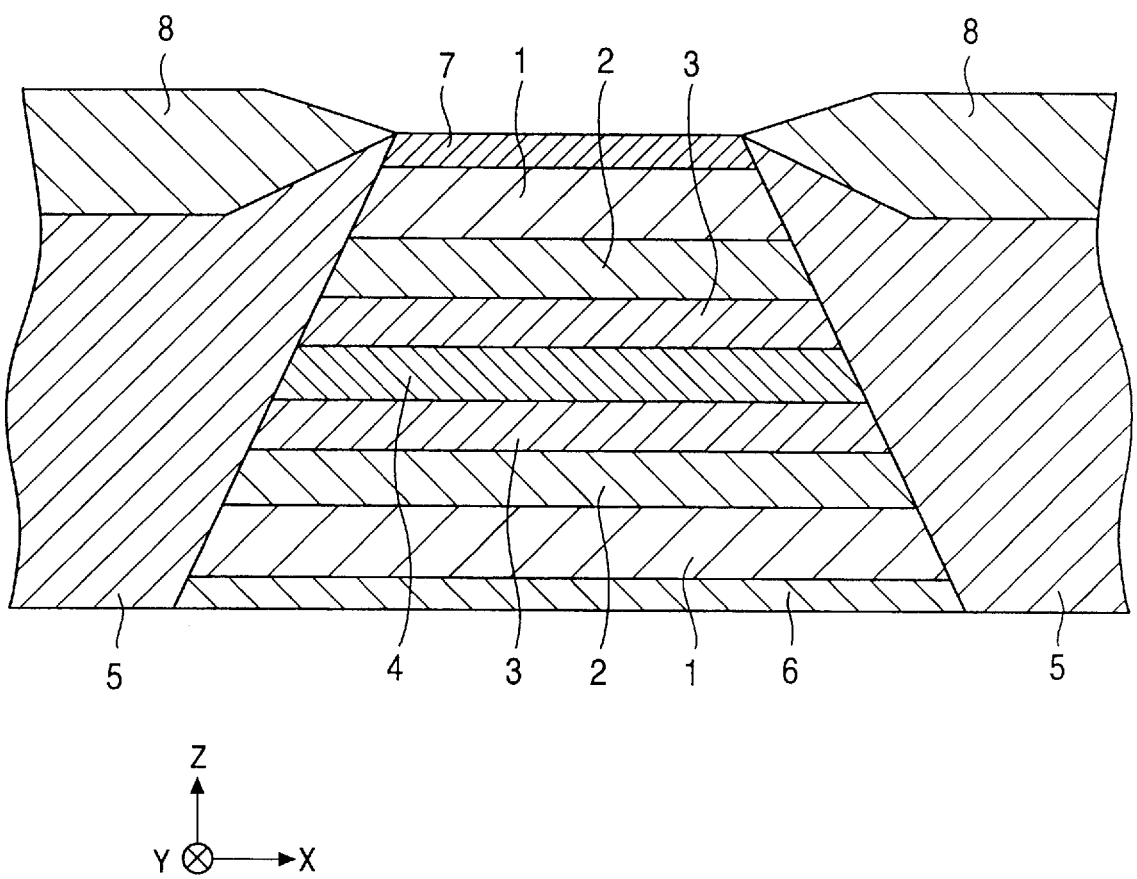
FIG. 3 is a cross section of the structure of the spin-valve type thin film element according to the third embodiment of the present invention viewed from the ABS side.

The layer formed at the lowest part in FIG. 1 is an underlayer 6 formed of a non-magnetic material such as Ta (tantalum). The antiferromagnetic layer 1, pinned magnetic layer 2, non-magnetic conductive layer 3 and free magnetic layer 4 are laminated in this order on the underlayer 6. A protective layer 7 made of, for example, Ta is layered on the free magnetic layer 4. FIG. 2 is a cross section of the structure of the spin-valve type thin film element according to the second embodiment of the present invention viewed from the ABS side. Contrary to the case shown in FIG. 1, the free magnetic layer 4, non-magnetic conductive layer 3, pinned magnetic layer 2 and antiferromagnetic layer 1 are laminated in this order on the underlayer 6 formed of a non-magnetic material such as Ta. A protective layer formed of, for example, Ta is deposited on the antiferromagnetic layer 1. FIG. 3 is a cross section of the spin-valve type thin film element according to the third embodiment of the present invention viewed from the ABS side. The non-magnetic conductive layers 3, 3 are laminated on the top and bottom of the free magnetic layer 4 on the underlayer 6 formed of, for example, Ta while the pinned magnetic layers 2, 2 are laminated on one of the non-magnetic layer 3 and under the other non-magnetic conductive layer 3. The antiferromagnetic layers 1, 1 are laminated on one of the pinned magnetic layer 2 and under the other pinned magnetic layer 2, the protective layer 7 formed of a non-magnetic material such as Ta being formed on the uppermost layer.

The hard bias layers 5, 5 and conductive layers 8, 8 are laminated on both side faces of the multilayer films from the underlayer 6 to the protective layer 7.

According to the first, second and third embodiments of the present invention, an antiferromagnetic material that causes an exchange magnetic coupling by applying annealing (heat treatment) in the magnetic field is used as a material to form the antiferromagnetic layer 1.

It is preferable, for example, to use a Pt—Mn (platinum—manganese) alloy as the antiferromagnetic layer 1.

The Pt—Mn alloy has an excellent heat resistance as well as a high blocking temperature, also possessing an excellent characteristic such as a high exchange anisotropic magnetic field (Hex) as an antiferromagnetic material.

A X—Mn alloy (X=Pd, Rh, Ru, Ir and Os) or a Pt—Mn—X alloy (X=Ni, Pd, Rh, Ru, Ir, Cr and Co) may be used instead of the Pt—Mn alloy.

The preferable composition ratios of the Pt—Mn alloy and X—Mn alloy are (Pt or X):Mn=1:9 to 3:7 or 1:0.7 to 1:1.3, more preferably 1:1.

The pinned magnetic layer and free magnetic layer are formed of a Ni—Fe (nickel—iron) alloy, a Co—Fe (cobalt—iron) alloy, Co and a Co—Fe—Ni alloy.

The conductive layer is formed of a non-magnetic conductive material such as Cu (copper) having a low electric resistance.

Hard bias layers 5, 5 and conductive layers 8, 8 are deposited on both sides of the six layers of from the underlayer 6 to the protective layer 7 (referred to a laminated body hereinafter).

The hard bias layers 5, 5 are formed of, for example, the Co—Pt (cobalt—platinum) alloy and Co—Cr—Pt (cobalt—chromium—platinum) alloy. The conductive layer 8 is formed of W (tungsten) and cu (copper).

The method for producing the spin-valve type thin film element according to the present invention will be described hereinafter.

In the first embodiment of the present invention, the antiferromagnetic layer 1, pinned magnetic layer 2, non-magnetic conductive layer 3 and free magnetic layer 4 are deposited on the underlayer 6 while applying a magnetic field along the X-direction (the track width direction). The non-magnetic conductive layer 3 may be deposited without applying any magnetic field. The layers are. deposited at room temperature with no heating in this deposition step.

Deposition under a magnetic field along the X-direction allows the free magnetic layer 4 to arise inductive magnetic anisotropy along the X-direction, enabling magnetization of the free magnetic layer 4 to be aligned along the X-direction. In other words, the x-direction of the free magnetic layer 4 is made to be an easy axis of magnetization while the Y-direction is made to be a hard axis of magnetization.

Inductive magnetic field is also induced in the pinned magnetic layer 2 along the X-direction, making it possible to align magnetization of the pinned magnetic layer 2 along the X-direction.

Since at least the antiferromagnetic layer 1, pinned magnetic layer 2 and free magnetic layer 4 are deposited while applying a magnetic field along the X-direction in the present invention, only the magnetic field along the X-direction is impressed to the free magnetic layer 4, allowing inductive magnetic anisotropy of the free magnetic layer to be easily directed along the X-direction.

No exchange coupling is arisen at the interface between the antiferromagnetic layer 1 and pinned magnetic layer 2 in the deposition step at room temperature in the present invention, because the antiferromagnetic layer 1 is formed of an antiferromagnetic material that causes an exchange coupling only when a heat treatment is applied.

After depositing the laminated body, it is then subjected to a heat treatment while applying a magnetic field along the Y-direction (the height direction; the direction of the external magnetic field).

An exchange anisotropic magnetic field is generated by the exchange coupling at the interface between the antiferromagnetic layer 1 and pinned magnetic layer 2 due to the heat treatment, thereby fixing magnetization of the pinned magnetic layer along the Y-direction forming a single magnetic domain.

Although magnetization of the free magnetic layer 4 aligned along the X-direction by inductive magnetic anisotropy is once reversed along the Y-direction by the magnetic field along the Y-direction applied during the heat treatment, it is again aligned along the X-direction due to inductive magnetic anisotropy along the X-direction applied during deposition when the magnetic field is removed.

It is possible in the present invention to suppress the coercive force of the free magnetic layer, after depositing the laminated body from the underlayer 6 to the protective layer 7 and subjecting it to a heat treatment (the laminated body before depositing the hard bias layer 5 shown in FIG. 1), along the Y-direction to below 2 Oe (Oersted).

Then, after processing the laminated body into a trapezoidal shape by ion milling, the hard bias layers 5, 5 magnetized along the X-direction and the conductive layers 8, 8 are deposited on both sides of the laminated body.

A stationary current (a sensing current) is imparted to the pinned magnetic layer 2, non-magnetic conductive layer 3 and free magnetic layer 4 from conductive layer 8. Furthermore, when a magnetic field is applied along the Y-direction from the recording medium, the magnetization direction of the free magnetic layer 4 is turned from the X-direction to the Y-direction. Electrons to be transferred from one layer of the free magnetic layer 4 and pinned magnetic layer 2 to the other layer of them are scattered at the interface between the non-magnetic conductive layer 3 and pinned magnetic layer 2 or at the interface between the non-magnetic conductive layer 3 and free magnetic layer 4, allowing the electric resistance to change that causes variation of the stationary current to obtain a sensing output.

As hitherto described, it is made possible in the present invention to deposit the antiferromagnetic layer 1, pinned magnetic layer 2 and free magnetic layer 4 while applying a magnetic field along the X-direction by forming the antiferromagnetic layer 1 out of an antiferromagnetic material that can arise an exchange coupling only when the antiferromagnetic layer 1 is subjected to a heat treatment.

Accordingly, inductive magnetic anisotropy of the free magnetic layer 4 can be directed along the X-direction in the step prior to depositing the hard bias layers 5, 5, making it possible to allow the X-direction of the free magnetic layer 4 to be an easy axis of magnetization. The coercive force of the free magnetic layer 4 along the Y-direction before depositing the hard bias layer 5 can be adjusted to 2 Oe or less in the present invention.

Since inductive magnetic anisotropy of the free magnetic layer 4 is allowed to be directed along the X-direction in the present invention as hitherto described, magnetization of the free magnetic layer 4 can be readily aligned along the X-direction in depositing the hard bias layer 5 magnetized along the X-direction, making it possible to produce a spin-valve type thin film element in which generation of the Barkhausen noises is sufficiently suppressed.

The antiferromagnetic layer 1, pinned magnetic layer 2 and free magnetic layer 4 can be deposited while applying the magnetic field only along the X-direction, so that the conventionally used sputtering apparatus capable of depositing in a magnetic field applied only along the X-direction can be used.

Although the antiferromagnetic layer 1, pinned magnetic layer 2, non-magnetic conductive layer 3 and free magnetic layer 4 are deposited in this order from the bottom to the top in the spin-valve type thin film element shown in FIG. 1, they may be inversely deposited in the order of the free magnetic layer 4, non-magnetic conductive layer 3, pinned magnetic layer 2 and antiferromagnetic layer 1 from the bottom to the top as shown in FIG. 2. The layers may be deposited in the order of the antiferromagnetic layer 1, pinned magnetic layer 2, non-magnetic conductive layer 3, free magnetic layer 4, non-magnetic conductive layer 3, pinned magnetic layer 2 and antiferromagnetic layer 1 from the bottom to the top as shown in FIG. 3.

Any deposition orders described above are valid because the antiferromagnetic layer 1 is formed of a foregoing antiferromagnetic material, a Pt—Mn alloy film for example, which can arise an exchange coupling at the interface between the antiferromagnetic layer 1 and pinned magnetic layer 2 even when the antiferromagnetic layer 1 is formed either on the pinned magnetic layer 2 or under the pinned magnetic layer 2.

The production method according to the present invention may be also used when the layers are deposited in the order of the free magnetic layer 4, non-magnetic conductive layer 3, pinned magnetic layer 2 and antiferromagnetic layer 1 from the bottom to the top. The layers may be deposited in the order of the antiferromagnetic layer 1, pinned magnetic layer 2, non-magnetic conductive layer 3, free magnetic layer 4, non-magnetic conductive layer 3, pinned magnetic layer 2 and antiferromagnetic layer 1 from the bottom to the top as shown in FIG. 3.

While the spin-dependent electrons are scattered at two sites of the interface between the non-magnetic conductive layer 3 and free magnetic layer 4 and the interface between the non-magnetic conductive layer 3 and pinned magnetic layer 2 in the single spin-valve type thin film element shown in FIG. 1 and FIG. 2, the conductive electrons are scattered at four sites of two interlayers between the non-magnetic conductive layer 3 and free magnetic layer 4 and two interlayers between the non-magnetic conductive layer 3 and pinned magnetic layer 2 in the dual spin-valve type thin film element as shown in FIG. 3. Accordingly, a larger resistance change ratio can be obtained in the dual spin-valve type thin film element than in the single spin-valve type thin film element.

EXAMPLE

Figure 4:
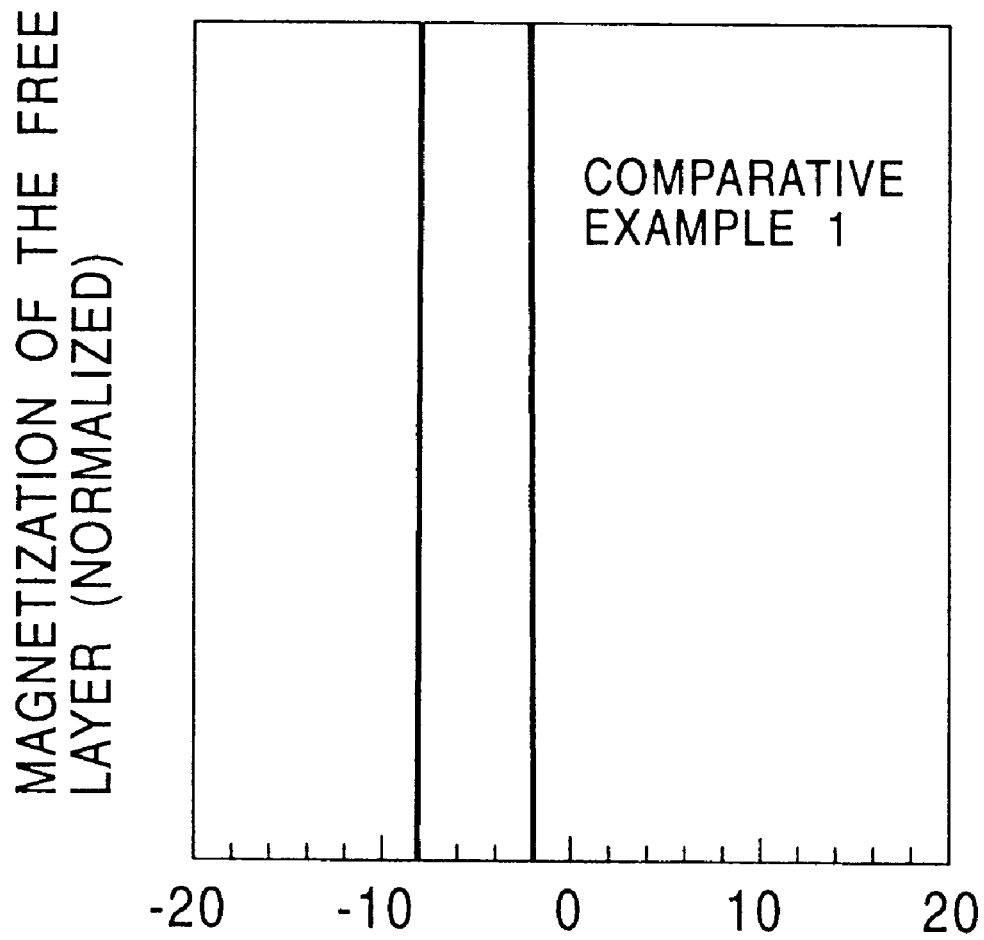
FIG. 4 is a hysteresis loop of the free magnetic layer along the height direction when all the layers of the free magnetic layer, non-magnetic conductive layer, pinned magnetic layer and antiferromagnetic layer were deposited by applying a magnetic field along the height direction.
Figure 5:
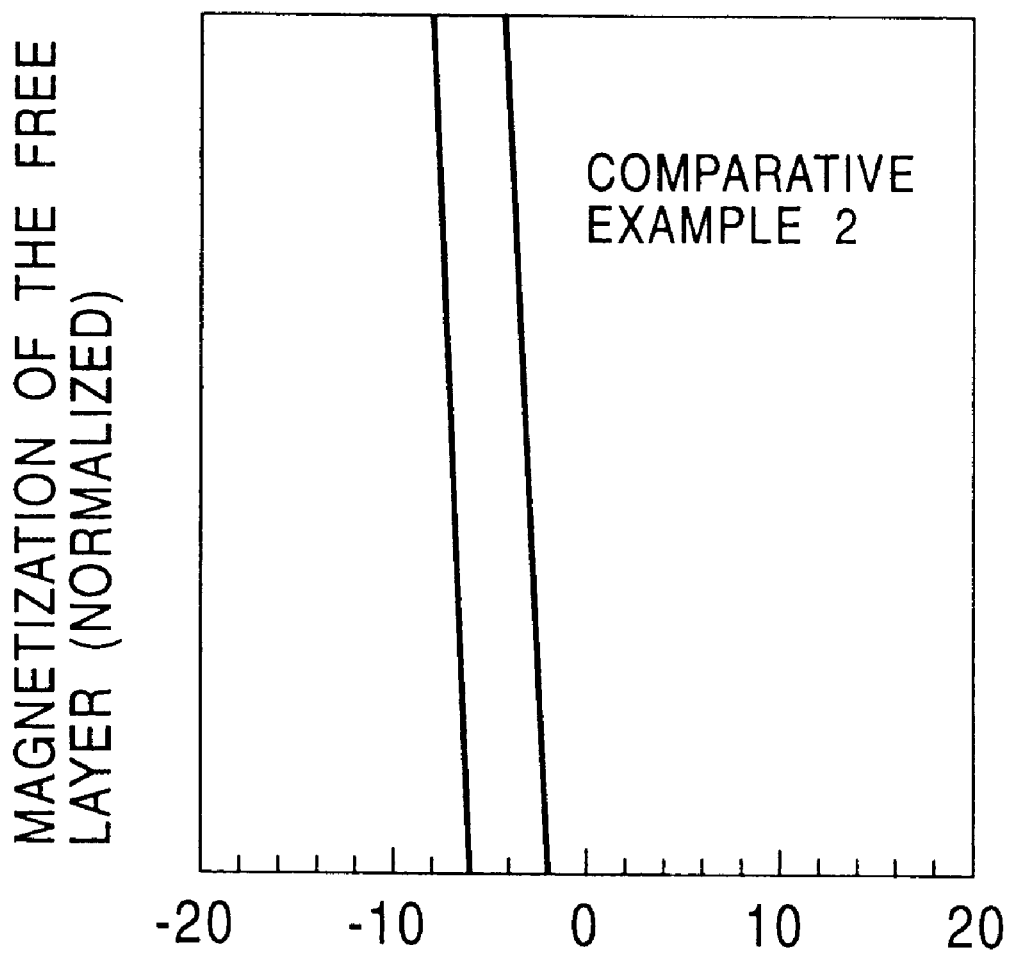
FIG. 5 is a hysteresis loop of the free magnetic layer along the height direction when the free magnetic layer is deposited by applying a magnetic field along the track width direction while the non-magnetic conductive layer and pinned magnetic layer were deposited by applying a magnetic field along the height direction.
Figure 6:
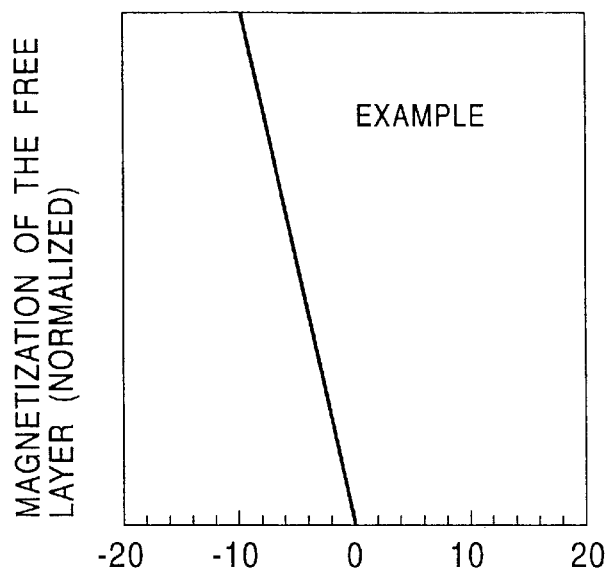
FIG. 6 is a hysteresis loop of the free magnetic layer along the height direction when all the layers of the free magnetic layer, non-magnetic conductive layer, pinned magnetic layer and antiferromagnetic layer were deposited by applying a magnetic field along the track width direction.
Figure 7:
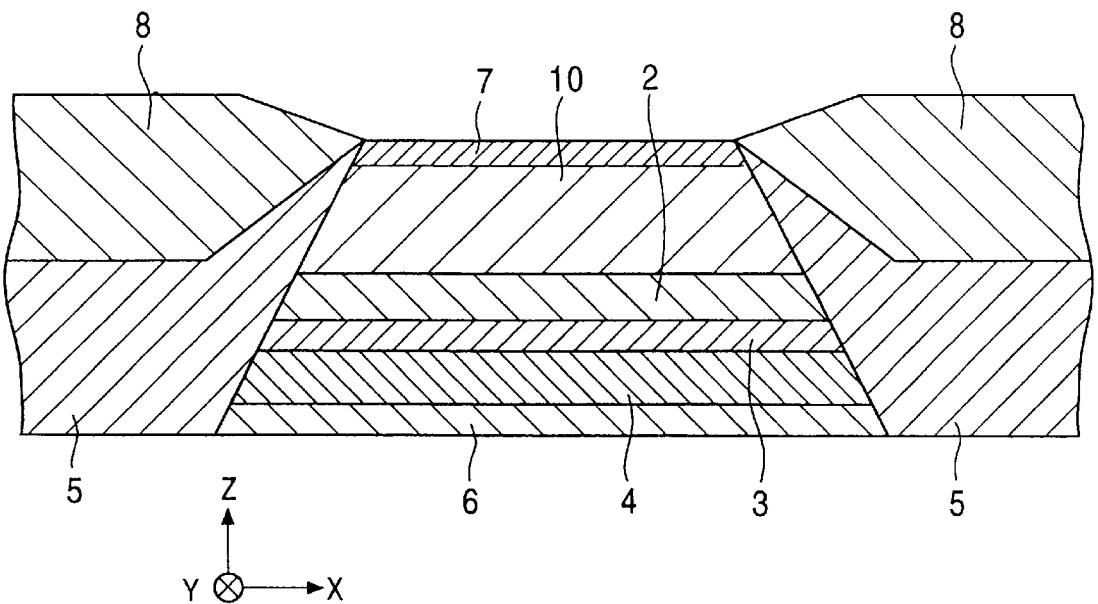
FIG. 7 is a cross section of the spin-valve type thin film element according to the conventional embodiment viewed from the ABS side.

Hysteresis loops of the free magnetic layers in respective spin-valve type film along the height direction were drawn using the spin-valve type films formed by two kinds of conventional production methods (Comparative Examples 1 and 2, and the spin-valve type film formed by the production method according to the present invention (Example). The experimental results are shown in FIG. 4 to FIG. 6.

The constructions of respective spin-valve type films in Example and Comparative Examples 1 and 2 were the same as shown below:

Si/alumina (aluminum oxide)/underlayer: Ta (50)/free magnetic layer: Ni—Fe (70)/free magnetic layer: Co (10)/non-magnetic conductive layer: Cu (28)/pinned magnetic layer: Co (20)/antiferromagnetic layer: Pt—Mn (300)/protective layer: Ta (50)

The numerals for each layer described in the parenthesis indicate the film thickness represented in an Angstrom unit.

A Pt—Mn alloy film that can arise an exchange coupling by applying a heat treatment was used for the antiferromagnetic layer with a composition ratio of Pt and Mn of 1:1.

The spin-valve type film in Comparative Example 1 were deposited by applying a magnetic field along the height direction for all the layers.

The spin-valve type film in Comparative Example 2 were deposited by applying a magnetic field along the height direction for all the layers except the free magnetic layer, the free magnetic layer being deposited by applying a magnetic field along the track width direction.

The spin-valve type film in Example was deposited by applying a magnetic field along the track width direction for all the layers.

After the deposition, the films in Comparative Example 1, Comparative Example 2 and Example were subjected to a head treatment at 230° C. while applying an external magnetic field of 2 kOe along the height direction.

An exchange anisotropic magnetic field with a strength of 800 Oe is generated at the interface between the antiferromagnetic layer (the Pt—Mn alloy film) and pinned magnetic layer (the Co film) in Example, Comparative Example 1 and Comparative Example 2, magnetization of the pinned magnetic layer being tightly fixed along the height direction.

In the case of Comparative Example 1, hysteresis loop of the free magnetic layer has a large width, indicating that the coercive force is large.

The result described above can be comprehended as follows: Since all the layers are deposited by applying a magnetic field along the height direction, inductive magnetic anisotropy of the free magnetic layer when deposition of all the layers in the laminated body has been completed is directed along the height direction. Moreover, since inductive magnetic anisotropy induced by the heat treatment in the magnetic field is also added along the height direction, inductive magnetic anisotropy of the free magnetic layer when the heat treatment in the magnetic layer has been completed is almost completely directed along the height direction, allowing the height direction to be an easy axis of magnetization.

Though the hysteresis loop in Comparative Example 2 shown in FIG. 5 has a smaller width than the hysteresis loop in Comparative Example 1, it can be seen that its coercive force is about 2 Oe.

Inductive magnetic anisotropy of the free magnetic layer when deposition of all the layers has been completed is directed approximately along the track width direction because, although the free magnetic layer is deposited by applying a magnetic field along the track width direction, the layers except the free magnetic layer are deposited by applying the magnetic field along the height direction. However, the direction is a little varied from the direction of inductive magnetic anisotropy applied when deposition of only the free magnetic layer has been completed, along with being a little smaller in magnitude. Since the heat treatment in the magnetic field allows inductive magnetic anisotropy induced during the heat treatment in the magnetic field to be applied along the height direction, inductive magnetic anisotropy of the free magnetic layer is averaged to be isotropic, rendering magnetization of the free magnetic layer not to be properly aligned along the track width direction.

Consequently, inversion of magnetization of the free magnetic layer poorly responds to the external magnetic field along the height direction, remaining a relatively large coercive force of about 2 Oe.

The hysteresis loop in Example shown in FIG. 6 has no width, indicating that the coercive force is very small. The coercive force of the free magnetic layer in Example is able to be suppressed at least below that of Comparative example, or below 2 Oe.

All the layers in Example is deposited while applying a magnetic field along the track width direction. Therefore, inductive magnetic anisotropy of the free magnetic layer when deposition of all the layers has been completed is directed along the track width direction likewise inductive magnetic anisotropy induced when deposition of only the free magnetic layer has been completed. Although it is the same as in Comparative Example 1 and Comparative Example 2 that inductive magnetic anisotropy induced by a heat treatment in the magnetic field is added along the height direction by subjecting the layer to heat treatment in the magnetic layer, residual inductive magnetic anisotropy along the track width direction is dominant after the heat treatment in the magnetic field, thereby allowing the track width direction and height direction to be approximately the easy axis of magnetization and hard axis of magnetization, respectively.

Accordingly, magnetization of the free magnetic layer is properly aligned along the track width direction and sensitively reversed in response to the external magnetic field, making it possible for the coercive force to be very small as shown in FIG. 4.

According to the present invention as hitherto described in detail, an antiferromagnetic material that can arise an exchange coupling by subjecting the ferromagnetic layer to a heat treatment, making it possible to deposit the antiferromagnetic layer, pinned magnetic layer and free magnetic layer while applying a magnetic field along the track width direction.

Since the magnetic field is impressed to the free magnetic layer only along the track width direction when the layer is deposited, inductive magnetic anisotropy of the free magnetic layer before depositing the bias layer can be securely directed along the track width direction.

It is possible in the present invention to suppress the coercive force of the free magnetic layer along the height direction to 2 Oe or less prior to depositing the bias layer.

Since inductive magnetic anisotropy of the free magnetic layer is possible to be properly aligned along the track width direction as hitherto described, magnetization of the free magnetic layer can be easily aligned along the track width direction, thus enabling to obtain a good reproduction characteristic in that, for example, decreasing the generation ratio of the Barkhausen noise.

According to the present invention, since all the deposition steps of the ferromagnetic layer, pinned magnetic layer and free magnetic layer can be carried out by applying a magnetic field along the track width direction, the conventionally used sputtering apparatus being able to deposit the layers in the uniaxially oriented magnetic field can be used, excluding the necessity for providing new facilities.

What is claimed is:

1. A spin-valve thin film element comprising:
   an antiferromagnetic layer;
   a pinned magnetic layer formed in contact with the antiferromagnetic layer, a magnetization direction of the pinned magnetic layer being fixed due to an exchange anisotropic magnetic field with said antiferromagnetic field and a free magnetic layer formed over said pinned magnetic layer via a non-magnetic conductive layer;
   a bias layer to align a magnetization direction of said free magnetic layer along a direction to cross with the magnetization direction of said pinned magnetic layer; and
   a conductive layer to impart a sensing current to the pinned magnetic layer,
   wherein said antiferromagnetic layer is formed of an antiferromagnetic material that induces an exchange coupling by applying a heat treatment and a coercive force of said free magnetic layer in the absence of the bias layer is not greater than 2 Oe but greater than zero Oe.

2. A spin-valve thin film element according to claim 1, wherein an inductive magnetic anisotropy of said free magnetic layer in the absence of the bias layer is directed along a track width direction.

3. A spin-valve thin film element according to claim 1, wherein said antiferromagnetic layer is formed of a Pt—Mn alloy.

4. A spin-valve thin film element according to claim 2, wherein said antiferromagnetic layer is formed of a Pt—Mn alloy.

5. A spin-valve thin film element according to claim 2, wherein said antiferromagnetic layer is formed of a X—Mn alloy and X=Ni, Pd, Rh, Ru, Ir or Os.

6. A spin-valve thin film element according to claim 2, wherein said antiferromagnetic layer is formed of a Pt—Mn—X alloy and X=Ni, Pd, Rh, Ru, Ir, Cr or Co.

7. A method for producing a spin-valve thin film element comprising:

forming an antiferromagnetic layer, a pinned magnetic layer formed in contact with the antiferromagnetic layer and in which a magnetization direction is fixed due to an exchange anisotropic magnetic field with said antiferromagnetic field and a free magnetic layer formed over said pinned magnetic layer via a non-magnetic conductive layer, a bias layer to align a magnetization direction of said free magnetic layer along a direction to cross with the magnetization direction of said pinned magnetic layer and a conductive layer to impart a sensing current to the pinned magnetic layer;

depositing at least the antiferromagnetic layer, pinned magnetic layer and free magnetic layer while applying a magnetic field along a track width direction, an inductive magnetic anisotropy of said free magnetic layer being induced along the track width direction;

applying a heat treatment after deposition while applying a magnetic field along a height direction to generate an exchange coupling at an interface between the antiferromagnetic layer and pinned magnetic layer, thereby fixing magnetization of said pinned magnetic layer along the height direction; and forming a laminated body comprising an antiferromagnetic layer, a pinned magnetic layer, a non-magnetic conductive layer and a free magnetic layer into prescribed shapes, followed by depositing bias layers magnetized along the track width direction on both sides of said laminated body.

8. A method for producing a spin-valve thin film element according to claim 7, further comprising forming the antiferromagnetic layer of a Pt—Mn alloy.

9. A method for producing a spin-valve thin film element according to claim 7, further comprising forming the antiferromagnetic layer from an X—Mn alloy, X=Ni, Pd, Rh, Ru, Ir, or Os.

10. A method for producing a spin-valve thin film element according to claim 7, further comprising forming the antiferromagnetic layer from an Pt—Mn—X alloy, X=Ni, Pd, Rh, Ru, Ir, Cr or Co.

11. A spin-valve thin film element comprising:

an antiferromagnetic layer;

a pinned magnetic layer formed in contact with the antiferromagnetic layer, a magnetization direction of the pinned magnetic layer being fixed due to an exchange anisotropic magnetic field with said antiferromagnetic field and a free magnetic layer formed under said pinned magnetic layer via a non-magnetic conductive layer;

a bias layer to align a magnetization direction of said free magnetic layer along a direction to cross with the magnetization direction of said pinned magnetic layer; and a conductive layer to impart a sensing current to the pinned magnetic layer, wherein said antiferromagnetic layer is formed of an antiferromagnetic material that induces an exchange coupling by applying a heat treatment and a coercive force of said free magnetic layer in the absence of the bias layer is not greater than 2 Oe but greater than zero Oe.

12. A spin-valve thin film element according to claim 11, wherein an inductive magnetic anisotropy of said free magnetic layer in the absence of the bias layer is directed along a track width direction.

13. A spin-valve thin film element according to claim 11, said antiferromagnetic layer being formed of a Pt—Mn alloy.

14. A spin-valve thin film element according to claim 12, said antiferromagnetic layer being formed of a Pt—Mn alloy.

15. A spin-valve thin film element according to claim 12, said antiferromagnetic layer being formed of a X—Mn alloy and X=Ni, Pd, Rh, Ru, Ir or Os.

16. A spin-valve thin film element according to claim 12, said antiferromagnetic layer being formed of a Pt—Mn—X alloy and X=Ni, Pd, Rh, Ru, Ir, Cr or Co.

17. A method for producing a spin-valve thin film element comprising:

forming an antiferromagnetic layer, a pinned magnetic layer formed in contact with the antiferromagnetic layer and in which a magnetization direction is fixed due to an exchange anisotropic magnetic field with said antiferromagnetic field and a free magnetic layer formed under said pinned magnetic layer via a non-magnetic conductive layer, a bias layer to align a magnetization direction of said free magnetic layer along a direction to cross with the magnetization direction of said pinned magnetic layer and a conductive layer to impart a sensing current to the pinned magnetic layer;

depositing at least the antiferromagnetic layer, pinned magnetic layer and free magnetic layer while applying a magnetic field along a track width direction, an inductive magnetic anisotropy of said free magnetic layer being induced along the track width direction;

applying a heat treatment after deposition while applying a magnetic field along a height direction to generate an exchange coupling at an interface between the antiferromagnetic layer and pinned magnetic layer, thereby fixing magnetization of said pinned magnetic layer along the height direction; and forming a laminated body comprising an antiferromagnetic layer, a pinned magnetic layer, a non-magnetic conductive layer and a free magnetic layer into prescribed shapes, followed by depositing bias layers magnetized along the track width direction on both sides of said laminated body.

18. A method for producing a spin-valve thin film element according to claim 17, further comprising forming the antiferromagnetic layer of a Pt—Mn alloy.

19. A method for producing a spin-valve thin film element according to claim 17, further comprising forming the antiferromagnetic layer from an X—Mn alloy, X=Ni, Pd, Rh, Ru, Ir, or Os.

20. A method for producing a spin-valve thin film element according to claim 17, further comprising forming the antiferromagnetic layer from an Pt—Mn—X alloy, X=Ni, Pd, Rh, Ru, Ir, Cr or Co.

* * * * *

UNITED STATES PATENT AND TRADEMARK OFFICE
CERTIFICATE OF CORRECTION

PATENT NO. : 6,115,224
DATED : September 5, 2000
INVENTOR(S) : Masamichi Saito

It is certified that error appears in the above-identified patent and that said Letters Patent is hereby corrected as shown below:

Title page, Column 2,
ABSTRACT,
Line 20, change "vias" to -- bias --.

Claim 5,
Line 2, change "a X-Mn" to -- an X-Mn --.

Claim 10,
Line 3, change "an Pt-Mn-X" to -- a Pt-Mn-X --.

Claim 15,
Line 2, change "a X-Mn" to -- an X-Mn --.

Claim 20,
Line 3, change "an Pt-Mn-X" to -- a Pt-Mn-X --.

Signed and Sealed this

Twenty-sixth Day of February, 2002

Attest:

JAMES E. ROGAN
*Director of the United States Patent and Trademark Office*

*Attesting Officer*